United States Patent
Li

(10) Patent No.: US 6,385,752 B1
(45) Date of Patent: May 7, 2002

(54) METHOD AND APPARATUS FOR PUNCTURING A CONVOLUTIONALLY ENCODED BIT STREAM

(75) Inventor: Diana D. Li, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/323,012

(22) Filed: Jun. 1, 1999

(51) Int. Cl.[7] ............................................. H03M 13/00
(52) U.S. Cl. ...................................................... 714/790
(58) Field of Search ............................ 714/786; 375/265

(56) References Cited

U.S. PATENT DOCUMENTS

| | | | |
|---|---|---|---|
| 5,438,590 A | 8/1995 | Tsukerman et al. | 375/259 |
| 5,511,082 A | 4/1996 | How et al. | 714/786 |
| 5,668,820 A | 9/1997 | Ramesh et al. | 714/786 |
| 6,170,076 B1 * | 1/2001 | Kim | 714/786 |
| 6,209,116 B1 * | 3/2001 | Hammons, Jr. et al. | 714/786 |

FOREIGN PATENT DOCUMENTS

EP 0643510 9/1994 ............. H04L/1/18

OTHER PUBLICATIONS

Matsuoka et al., adaptive modulation system with punctured convolutional code for high quality personal communication systems, IEEE, p. 22–23, 1995.*

Pirhonen et al., Single slot 14.4K bit/s service for GMS, IEEE, p. 943–947, 1996.*

* cited by examiner

*Primary Examiner*—Albert Decady
*Assistant Examiner*—Shelly A. Chase

(57) ABSTRACT

An improved method of puncturing a convolutionally encoded bit stream is provided. Assuming that the convolutionally encoded bit stream has been encoded at rate k/n, puncturing is performed in clusters of n-bit consecutive bits each, these clusters being evenly distributed throughout the encoded bit stream. Improved puncturing matrices are provided for the specific examples consisting of PCS-4 and PCS-5, these being encoding schemes provided in accordance with the EDGE standard.

24 Claims, 1 Drawing Sheet

METHOD AND APPARATUS FOR PUNCTURING A CONVOLUTIONALLY ENCODED BIT STREAM

FIELD OF THE INVENTION

The invention relates to a method and apparatus for puncturing a convolutionally encoded bit stream. More particularly it relates to improved puncture matrices for use in TDMA (time division multiple access) and GSM (Global System for Mobile Communications) applications such as EDGE (enhanced data rate for GSM evolution).

BACKGROUND OF THE INVENTION

Many communication systems process a block of data for transmission by first convolutionally encoding it to produce an encoded block, then puncturing the convolutionally encoded block by removing a certain number of bits to produce a punctured encoded block which has a proper size for interleaving, and finally by interleaving the punctured encoded block.

For example, EDGE is a next generation GSM TDMA standard in which, before being transmitted in bursts, 20 ms blocks of data are convolutionally encoded, punctured, and rectangularly interleaved over four bursts.

The conventional approach to performing such puncturing for GSM has been to spread the puncture locations uniformly throughout the encoded bursts, puncturing a single bit at each location, never puncturing consecutive bits. The thought process historically has been that puncturing consecutive bits would produce more errors and as such inferior performance.

Other approaches for performing puncturing which are not tailored to a GSM environment are taught in U.S. Pat. No. 5,438,590 which issued Aug. 1, 1995 to Tzukerman et al. In this example, the puncturing is performed after the interleaving for a completely different purpose. Several puncturing matrices are proposed which include consecutively punctured bits, but the consecutively punctured bits are not evenly spaced, and the number of consecutively punctured bits is unrelated to the rate of the convolutional code. The puncturing is optimized for a very particular application unrelated to the problem at hand.

U.S. Pat. No. 5,668,820 which issued Sep. 16, 1998 to Ramesh et al. teaches a coder with a convolutional coding circuit of rate k/n to produce a convolutionally coded output, and a puncturing circuit for puncturing the convolutionally coded output to achieve a punctured code rate of z/q, where z=γk. The puncturing circuit punctures the convolutionally coded output according to a deleting pattern chosen to have a bit length of L=pγn, where p>=2. The puncturing circuit outputs a punctured output at a punctured code rate of z/q. The purpose of the puncturing is to output data at a coded rate which is larger than the convolutional code rate and to thereby improve throughput.

U.S. Pat. No. 5,511,082 which issued Apr. 23, 1996 to How et al. teaches three very specific punctured convolutional encoders. In these encoders, a rate ½ code is punctured to rates ¾, ⅘ and 6/7 respectively using various specific puncturing maps.

It would be desirable to have a method and system for performing puncturing, for example in the GSM environment, which leads to performance improvements over existing methods.

SUMMARY OF THE INVENTION

It is an object of the invention to obviate or mitigate one or more of the above identified disadvantages.

According to a broad aspect, the invention provides a method of puncturing a convolutionally encoded bit stream consisting of an input bit stream which has been convolutionally encoded at a coding rate of k/n to produce the convolutionally encoded bit stream such that for each k-bit block of data to be encoded, an n-bit block in the convolutionally encoded bit stream is produced, where k>=1, and n>k. The method involves puncturing the convolutionally encoded data in only clusters of n consecutive bits each. Preferably, each cluster is aligned with a respective one of the k-bit blocks.

The puncturing is done in a manner which punctures sufficient bits from input blocks of L bits such that blocks of M bits each remain, where M is a required block size for interleaving. Preferably, the clusters are equally spaced throughout each L-bit block of bits.

In preferred embodiments, the new methods are applied to encoding schemes in accordance with existing EDGE standards for PCS-4 and PCS-5, but with modifications to the puncturing matrix used.

For PCS-5 in one case, the blocks to be punctured have a size of L=2422, and these need to be punctured such that M=1384 bits remain. A puncturing matrix is preferably defined by P(n)=1 ∀n In except for n=14k+2, 14k+3, 14k+6, 14k+7, 14k+10, 14k+11, k∈0, . . . , 172 where P(n)=0 where P(n)=1 means the nth bit location in the L-bit block is not punctured and P(n)=0 means the nth bit location in the L-bit block is punctured.

For PCS-5 in another case, the blocks to be punctured have a size of L=2306, and these need to be punctured such that M=1384 bits remain. A puncturing matrix is preferably defined by P(n)=1, ∀n except for n=10k+4, 10k+5, 10k+8, 10k+9k∈0, . . . , 229, and n=2304,2305 where P(n)=0 where P(n)=1 means the nth bit location in the L-bit block is not punctured and P(n)=0 means the nth bit location in the L-bit block is punctured.

For PCS-4, the blocks to be punctured have a size of L=2076 and M is again 1384. Preferably the puncturing matrix is defined by P(n)=1, ∀n except for n=12k+2, 12k+3, 12k+8, 12k+9 k∈0, . . . , 172 where P(n)=0.

According to another broad aspect, the invention provides an apparatus having a transmission mask circuit which punctures bits from L-bit blocks so as to produce M-bit blocks, where L,M are integers and M<L, and having a puncturing matrix memory defining a series of bit locations to puncture, the bit locations to puncture consisting of clusters of n consecutive bit locations each where n>=2.

The apparatus may further include a convolutional encoder for encoding an input bit stream at a rate k/n to produce a bit stream containing the L-bit blocks, where k<n, and/or an interleaver for performing interleaving on the M-bit blocks.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
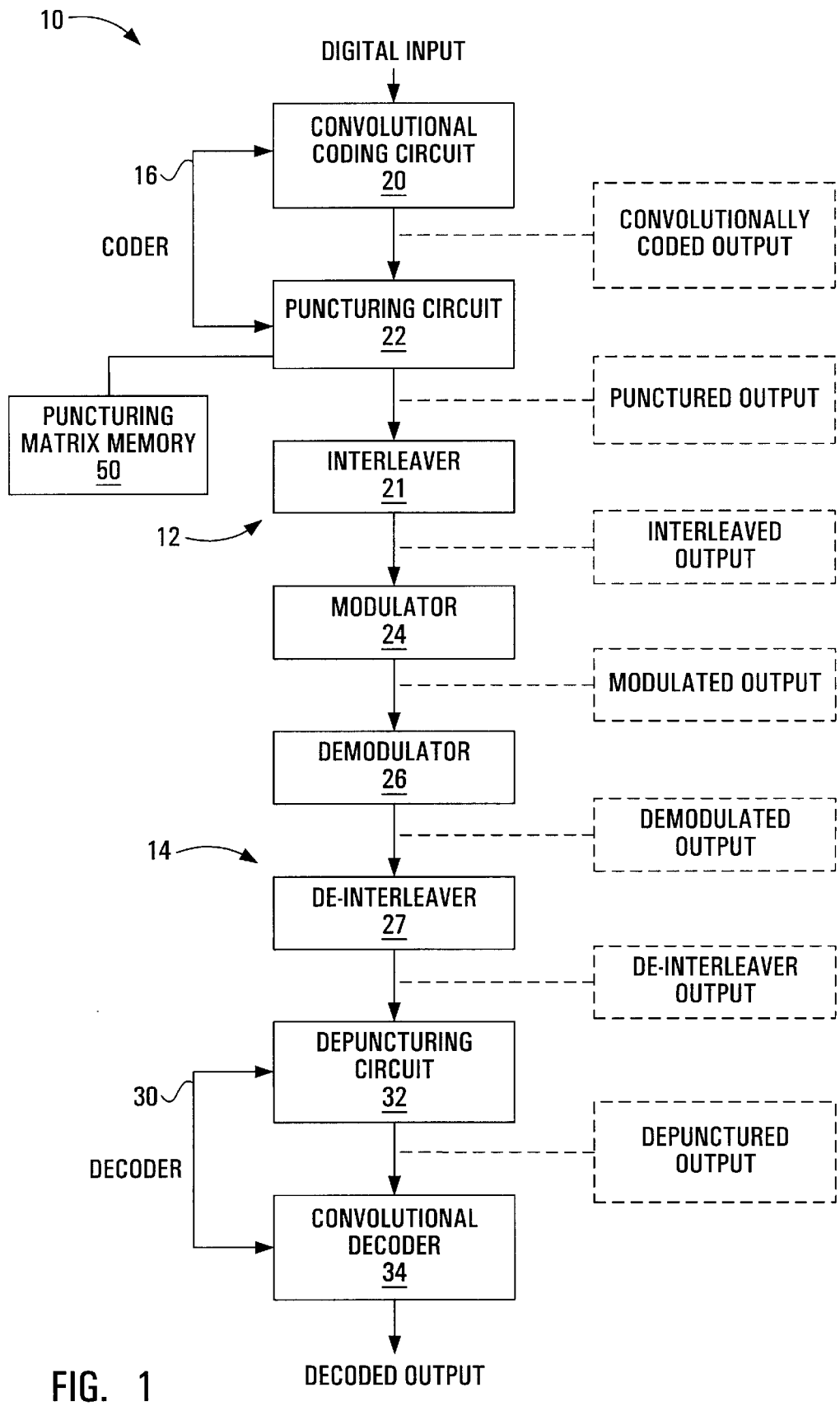
FIG. 1 is a block diagram of a communication system featuring a puncturing circuit according to an embodiment of the invention.

Referring firstly to FIG. 1, a digital communication system having a transmitter featuring the punctured convolutional coding method and apparatus of the present invention is indicated generally by the numeral 10. The digital communication system 10 generally includes a transmitter 12 for coding and transmitting a digital input, and a receiver 14 for receiving and decoding the transmitted, coded input. The transmitter 12 includes the general components of a coder 16 having a convolutional coding circuit and a puncturing circuit 22 for coding the digital input, an interleaver 21 and a modulator 24 for transmitting the coded interleaved input. As schematically shown in FIG. 1, the convolutional coding circuit 20 codes the digital input to generate a convolutionally coded output and the puncturing circuit 22 punctures the convolutionally coded output to generate a punctured output. The interleaver 21 performs interleaving to generate an interleaved output. After the input has been coded by coder 16, and interleaved by interleaver 21, modulator 24 modulates the interleaved output and transmit the modulated output to receiver 14.

The convolutional coding circuit 20 performs rate k/n convolutional encoding meaning that for every k bits input to the circuit, n bits are output by the circuit. In all cases, $k \geq 1$, and $n > k$. Preferably k=1. More preferably, k=1 and n=2.

Receiver 14 contains known components including a demodulator 26, deinterleaver 27, a decoder 30 having a depuncturing circuit 32, and a convolutional decoder 34. The demodulator 26 demodulates the modulated output received from the transmitter 12 and outputs to deinterleaver 27 a demodulated output. The deinterleaver 27 deinterleaves the demodulated output and outputs to decoder 30 a deinterleaved output. The depuncturing circuit 32 outputs a depunctured output and convolutional decoder 34 decodes the depunctured output and outputs a decoded output corresponding to the digital input. The convolutional decoder 34 may for example be a Viterbi decoder which processes received bits in groups of n, recalling that the convolutional coding rate at the transmitter was k/n.

Returning now to further details of the transmitter 12, the interleaver 21 takes M-bit blocks of bits received from the puncturing circuit 22, and reorganizes them such that the output of the interleaver 21 consists of a sequence of bits which were not originally adjacent in the incoming block. Preferably, as specified in EGPRS (enhanced General Packet Radio Services), incoming bits are delivered in 20 ms blocks, and the interleaver 21 performs rectangular interleaving over four such blocks. As detailed below, in EGPRS, the punctured output consists of M=1384 bit blocks, and this is equivalent to four bursts of 346 bits. The interleaver 21 block rectangular interleaves over these four bursts.

The puncturing circuit 22 is coupled to the convolutional encoder 20 and receives the coded output. The puncturing circuit performs puncturing block-wise by deleting enough bits from each L-bit coded block in each block of coded bits such that the punctured block is the correct size for the interleaver 21, this being M-bits. The puncturing circuit 22 is connected to a puncturing matrix memory 50. More generally, the puncturing circuit 22 must be capable of puncturing bit locations defined by a certain puncturing matrix. This puncturing matrix could be stored in a dedicated memory such as puncturing matrix memory 50 for the illustrated embodiment, or be implemented in software or hardware or a combination of software and hardware. The puncturing circuit 22 functions to puncture the convolutionally coded bit stream as it passes there through to produce a punctured output. In other words, the puncturing circuit 22 transmits selected bits in the convolutionally coded output and fails to transmit other selected bits. The puncturing circuit 22 may for example have a transmission mask circuit to prevent transmission of the required bits.

As the convolutionally coded output passes through the puncture circuit 22, blocks of convolutionally coded output are punctured according to the puncturing matrix stored in the puncturing matrix memory 50. The puncturing matrix in a series of ones and zeros, with each one representing a transmission bit and each zero representing a non-transmission bit. The puncturing matrix bits have a one-to-one correspondence with the bits in each L-bit block. The number of ones in the puncturing matrix equals the desired block size, M, for interleaving.

According to the invention, puncturing is performed using a puncturing matrix which has clusters of puncture locations, with each cluster being equal in size to "n", where n is the denominator of the convolutional coding rate k/n.

Preferably, each cluster is located such as to result in a complete code word being punctured. Thus, for a rate k/n=½ code, clustering is performed in clusters of n=2 consecutive bits, and if the bits consist of bits 0,1, . . . , L-1, then clustering in code word locations means that only bit sequences of the form (2i,2i+1) are eligible for puncturing. For a rate k/n=⅓ code, clustering is performed in clusters of n=3 consecutive bite, and if the bits consist of bits 0,1, . . . , L-1, then clustering in code word locations means that only bit sequences of the form (3i,3i+1,3i+2) are eligible for puncturing. Preferably, the puncturing is performed by evenly spacing the clusters through the coded L-bit block.

More generally, for the preferred embodiment, for a rate k/n code, clustering is performed in clusters of n consecutive bits. If the bits consist of bits 0,1, . . . , L, then bit clusters at locations (n*i, n*i+1, . . . , n*i+n−1) are eligible for puncturing.

Six coding schemes are specified in EGPRS for 8-PSK, not taking any bit classes into account. In each of these encoding schemes, prior to encoding each block includes 20 ms worth of input bits, and 0 or 6 tail bits. The input bits and tail bits are convolutionally encoded to produce encoded blocks with L bits each.

For these examples, the block size required for interleaving is 1384 bits. Thus, the puncturing in each of the above coding schemes must result in output blocks M=1384 bits in length. The number of bits which must be punctured is equal to L (encoded block size)—M (size for interleaving).

The six coding schemes are summarized in Table 1 below in which two "cases" have been included for PCS-5. This is because of the fact that in the EDGE standard as published there is error for PCS-5. The standard indicates that a block size of 2422 should be punctured in 922 puncture locations to produce the required size of 1384 for interleaving. However, these numbers do not add up, and in fact, puncturing 922 locations would only reduce a block size of 2306 to 1384. To reduce a block size of 2422 bits to 1384 would require 1038 puncture locations. Thus the table includes a "first case" in which the block size is 2306, and a "second case", in which the block size is 2422.

TABLE 1

PCS Coding Schemes

| Coding Scheme | PCS-6 | PCS-5 First Case | PCS-5 Second Case | PCS-4 | PCS-3 | PCS-2 | PCS-1 |
|---|---|---|---|---|---|---|---|
| Radio Interface Rate (kbps) | 69.2 | 57.35 | 57.35 | 51.6 | 41.25 | 34.3 | 22.8 |
| Input bits (per 20ms block) | 1384 | 1147 | 1205 | 1032 | 825 | 686 | 456 |
| Convolutional coding rate | n.a. | ½ | ½ | ½ | ½ | ½ | ⅓ |
| Tail bits | n.a. | 6 | 6 | 6 | 6 | 6 | 6 |
| Number of encoded bits, L | n.a. | 2306 | 2422 | 2076 | 1662 | 1384 | 1386 |
| Remaining bits after puncturing, M | n.a. | 1384 | 1384 | 1384 | 1384 | 1384 | 1384 |
| Output bits | 1384 | 1384 | 1384 | 1384 | 1384 | 1384 | 1384 |
| Number of bits punctured, L-M | 0 | 922 | 1038 | 692 | 278 | 0 | 2 |

The conventional puncturing schemes are outlined as follows for each of the above encoding schemes, where $P(n)=1$ indicates a non-punctured bit location, and $P(n)=0$ indicates a punctured bit location.

PCS-1

The puncturing matrix p is defined by:
$P(n)=1$, $\forall n$ except for n=457,947 where $P(n)=0$

PCS-2

No puncturing is used.

PCS-3

$P(n)=1$, $\forall n$ except for n=12k, 12k+5 k$\in$0, ..., 138 where $P(n)=0$

PCS-4

The puncturing matrix P is defined by:
$P(n)=1$, $\forall n$ except for n=12k, 12k+5, 12k+7, 12k+8 k$\in$0, ..., 172 where $P(n)=0$ PCS-5—First Case The puncturing matrix P is defined by:
$P(n)=1$, $\forall n$ except for n=10k+3, 10k+5, 10k+7, 10k+9 k$\in$0, ..., 230
and n=2303,2305 where $P(n)=0$.

The EDGE standard does not deal with the second PCS-5 case mentioned above and summarized in Table 1.

PCS-6

This is an uncoded scheme, and hence no puncturing is applied.

According to two preferred embodiments of the invention, revised puncture matrices are provided for PCS-4 and PCS-5 respectively both of which are rate k/n=½ codes and as such, in accordance with the invention, puncturing is done in equally spaced clusters of n=2 bits each. Preferably, the following specific puncturing matrices are used:

PCB-4

The puncturing matrix P is defined by:
$P(n)=1$, $\forall n$ except for n=12k+2, 12k+3, 12k+8, 12k+9 k$\in$0, ..., 172 where $P(n)=0$ PCS-5—First Case For the case where 2306 bit blocks are punctured in 922 locations, the puncturing matrix P is defined by:
$P(n)=1$ $\forall n$ except for n=10k+4, 10k+5, 10k+8, 10k+9 k$\in$0, ..., 229
and n=2304,2305 where $P(n)=0$ PCS-5—Second Case For the case where 2422 bit blocks are punctured in 1038 locations, the puncturing matrix P is defined by:
$P(n)=1$ $\forall n$ except for n=14k+2, 14k+3, 14k+6, 14k+7, 14k+10, 14k+11, k$\in$0, ..., 172 where $P(n)=0$.

Numerous modifications and variations of the present invention are possible in light of the above teachings. It is therefore to be understood that within the scope of the appended claims, the invention may be practised otherwise than as specifically described herein.

What is claimed is:

1. A method of puncturing a convolutionally encoded bit stream, the convolutionally encoded bit stream comprising an input bit stream which has been convolutionally encoded at a coding rate of k/n to produce the convolutionally encoded bit stream such that for each k-bit block of data to be encoded, an n-bit block in the convolutionally encoded bit stream is produced, where k>=1, and n>k, the method comprising:

puncturing the convolutionally encoded bit stream in only clusters of n consecutive bits each, where n≧3.

2. A method according to claim 1 wherein puncturing the convolutionally encoding data is done for input blocks of L bits; and said step of puncturing the convolutionally encoded data in clusters of n-bits each comprises puncturing sufficient bits such that the input blocks of L bits are reduced in size to M bits, where M is a required block size for interleaving.

3. A method according to claim 2 wherein the clusters are equally spaced through each L-bit block.

4. A method according to claim 2 wherein L=2306 and M=1384.

5. A method according to claim 2 wherein L=2422 and M=1384.

6. A method according to claim 2 wherein L=2076 and M=1384.

7. A method according to claim 1 wherein k=1.

8. A method of puncturing a convolutionally encoded bit stream, the convolutionally encoded bit stream comprising an input bit stream which has been convolutionally encoded at a coding rate of k/n to produce the convolutionally encoded bit stream such that for each k-bit block of data to be encoded, an n-bit block in the convolutionally encoded bit stream is produced, where k>=1, and n>k, the method comprising:
  puncturing the convolutionally encoded bit stream in only clusters of n consecutive bits each, wherein each said cluster is aligned with a respective one of said k-bit blocks of bits.

9. A method according to claim 2 wherein said clusters are equally spaced through the convolutionally encoded bit stream.

10. A method of puncturing a convolutionally encoded bit stream, the convolutionally encoded bit stream comprising an input bit stream which has been convolutionally encoded at a coding rate of k/n to produce the convolutionally encoded bit stream such that for each k-bit block of data to be encoded, an n-bit block in the convolutionally encoded bit stream is produced, where k>=1, and n>k, the method comprising:
  puncturing the convolutionally encoded bit stream in only clusters of n consecutive bits each, for input blocks of L bits,
    wherein L=2306 and sufficient bits are punctured so that the input blocks of L bits are reduced in size to M bits, where M is a required block size for interleaving and M=1384, each L-bit block contains bit locations 0, 1, . . . , 2305 and a puncturing matrix is defined by P(n)=1, ∀n except for n=10k+4, 10K+5, 10k+8, 10k+9, k∈0, . . . ,229, and n=2304, 2305 where P(n)=0 where P(n)=1 means the nth bit location in the L-bit block is not punctured and P(n)=0 means the nth bit location in the L-bit block is punctured.

11. A method according to claim 10 for application in an EDGE PCS-5 encoding scheme except for modifications to the puncturing matrix.

12. A method of puncturing a convolutionally encoded bit stream, the convolutionally encoded bit stream comprising an input bit stream which has been convolutionally encoded at a coding rate of k/n to produce the convolutionally encoded bit stream such that for each k-bit block of data to be encoded, an n-bit block in the convolutionally encoded bit stream is produced, where k>=1, and n>k, the method comprising:
  puncturing the convolutionally encoded bit stream in only clusters of n consecutive bits each, for input blocks of L bits,
    wherein L=2422 and sufficient bits are punctured such that the input blocks of L bits are reduced in size to M bits, where M is a required block size for interleaving and M=1384, each L-bit block contains bit locations 0, 1, . . . , 2421 and a puncturing matrix is defined by P(n)=1, ∀n except for n=14k+2, 14k+3, 14k+6, 14k+7, 14k+10, 14k+11, k∈0, . . . , 172 where P(n)=0 where P(n)=1 means the nth bit location in the L-bit block is not punctured and P(n)=0 means the nth bit location in the L-bit block is punctured.

13. A method according to claim 12 for application in an EDGE PCS-5 encoding scheme except for modifications to the puncturing matrix.

14. A method of puncturing a convolutionally encoded bit stream, the convolutionally encoded bit stream comprising an input bit stream which has been convolutionally encoded at a coding rate of k/n to produce the convolutionally encoded bit stream such that for each k-bit block of data to be encoded, an n-bit block in the convolutionally encoded bit stream is produced, where k>=1, and n>k, the method comprising:
  puncturing the convolutionally encoded bit stream in only clusters of n consecutive bits each, for input blocks of L bits,
    wherein L=2076 and sufficient bits are punctured such that the input blocks of L bits are reduced in size to M bits, where M is a required block size for interleaving and M=1384, each L-bit block contains bit locations 0, 1, . . . , 2075 and a puncturing matrix is defined by P(n)=1, ∀n except for n=12k+2, 12k+3, 12k+8, 12k+9, k∈0, . . . , 172 where P(n)=0 where P(n)=1 means the nth bit location in the L-bit block is not punctured and P(n)=0 means the nth bit location in the L-bit block is punctured.

15. A method according to claim 14 for application in an EDGE PCS-4 encoding scheme except for modifications to the puncturing matrix.

16. An apparatus comprising:
  a transmission mask circuit which punctures bits from L-bit blocks so as to produce M-bit blocks, where L,M are integers and M<L;
  a puncturing matrix memory defining a series of bit locations to be punctured by the transmission mask circuit, the bit locations to puncture consisting of clusters of n consecutive bit locations each where n>=2.

17. An apparatus according to claim 16 wherein the clusters are equally spaced.

18. An apparatus according to claim 17 further comprising:
  a convolutional encoder for encoding an input bit stream at a rate k/n, where k,n are integers, k≧1, and k<n.

19. An apparatus according to claim 18 further comprising an interleaver for performing interleaving on Said M-bit blocks.

20. A TDMA (time division multiple access) transmitter comprising:
  a convolutional encoder for encoding an input bit stream at a rate k/n to produce an encoded bit stream;
  a puncturing circuit which punctures bits from L-bit blocks of said encoded bit stream in clusters of n consecutive bit locations where n≧2 to produce M-bit blocks; and
  an interleaver for performing interleaving on said M-bit blocks.

21. A transmitter according to claim 20 wherein the convolutional encoder encodes k-bit blocks of data to produce n-bit blocks of data, and wherein each said cluster is aligned with a respective one of said k-bit blocks of bits.

22. A TDMA (time division multiple access) transmitter comprising:
  a convolutional encoder for encoding an input bit stream at a rate k/n to produce an encoded bit stream;
  a puncturing circuit which punctures bits from L-bit blocks of said encoded bit stream in clusters of n consecutive bit locations where n >2 to produce M-bit blocks; and
  an interleaver for performing interleaving on said M-bit blocks,
    wherein each L-bit block contains bit locations 0,1, . . . , 2421 and a puncturing matrix is defined by P(n)=1, ∀n except for n=14k+2, 14k+3, 14k+6, 14k+7, 14k+10, 14k+11, k∈0, . . . , 172 where P(n)=0 where P(n)=1 means the nth bit location in the L-bit block is not punctured and P(n)=0 means the nth bit location in the L-bit block is punctured.

23. A TDMA (time division multiple access) transmitter comprising:

a convolutional encoder for encoding an input bit stream at a rate k/n to produce an encoded bit stream;

a puncturing circuit which punctures bits from L-bit blocks of said encoded bit stream in clusters of n consecutive bit locations where $n \geq 2$ to produce M-bit blocks; and an interleaver for performing interleaving on said M-bit blocks, wherein each L-bit block contains bit locations 0,1,..., 2075 and a puncturing matrix is defined by $P(n)=1$, $\forall n$ except for n=12k+2, 12k+3, 12k+8, 12k+9, k$\in$0, . . ., 172 where $P(n)=0$ where $P(n)=1$ means the nth bit location in the L-bit block is not punctured and $P(n)=0$ means the nth bit location in the L-bit block is punctured.

24. A TDMA (time division multiple access) transmitter comprising:

a convolutional encoder for encoding an input bit stream at a rate k/n to produce an encoded bit stream;

a puncturing circuit which punctures bits from L-bit blocks of said encoded bit stream in clusters of n consecutive bit locations where $n \geq 2$ to produce M-bit blocks; and an interleaver for performing interleaving on said M-bit blocks, wherein each L-bit block contains bit locations 0,1,..., 2305 and a puncturing matrix is defined by $P(n)=1$, $\forall n$ except for n=10k+4, 10k+5, 10k+8, 10k+9, k$\in$0, . . . , 229, and n=2304, 2305 where $P(n)=0$ where $P(n)=1$ means the nth bit location in the L-bit block is not punctured and $P(n)=0$ means the nth bit location in the L-bit block is punctured.

* * * * *